United States Patent [19]

Guillon et al.

[11] 4,039,963
[45] Aug. 2, 1977

[54] STABILIZER FOR THE BASE LEVEL OF AN AMPLIFIER

[75] Inventors: Henri Georges Guillon, Orsay; Kamal Labib Henein, Evry, both of France

[73] Assignee: Commissariat a l'Energie Atomique, Paris, France

[21] Appl. No.: 662,541

[22] Filed: Mar. 1, 1976

[30] Foreign Application Priority Data

Mar. 4, 1975 France .................. 75.06747

[51] Int. Cl.² ............................................. H03F 1/02
[52] U.S. Cl. ......................................... 330/9; 330/51; 330/85; 330/86
[58] Field of Search .................. 330/9, 51, 86, 85

[56] References Cited

U.S. PATENT DOCUMENTS

| 3,129,326 | 4/1964 | Balaban | 330/51 X |
| 3,330,347 | 6/1968 | Jones et al. | 330/51 X |
| 3,737,798 | 6/1973 | Faraguet et al. | 330/51 |

Primary Examiner—Rudolph V. Rolinec
Assistant Examiner—Lawrence J. Dahl
Attorney, Agent, or Firm—William R. Woodward

[57] ABSTRACT

The output of an amplification assembly is coupled with the input of an integrating circuit by means of a first controlled switch. The output of the integrating circuit is coupled with the input of an intermediate stage and subtracted from the amplifier input signal during quiescence of the amplifier. The signal delivered by the amplification assembly is also applied to the input of a logical detection circuit which opens the first switch and closes a second switch discharging the integrating circuit in response to any rapid-variation pulse applied to its input, thus disabling the integration-subtraction operation, but closes the first switch and opens the second to enable integration and subtraction when the signal applied to the input of the detection circuit is steady or is subject only to slow variations.

5 Claims, 3 Drawing Figures

STABILIZER FOR THE BASE LEVEL OF AN AMPLIFIER

This invention relates to a device for stabilizing the base level of an amplifier, from which an output signal representing an input event or measurement begins, as for example in an amplifier for a pulse-counting or pulse-evaluating circuit.

In more exact terms, the device in accordance with the invention makes it possible to correct at the output of an amplifier the drift which takes place in the continuous no-signal output level as a result of a certain number of parasitic phenomena.

In other words, when no signal is applied to the input of a direct counting amplifier, for instance it is found that the output signal is not zero and that in addition, the level of the output signal varies. An evident consequence of this is that, when a signal is applied to the input of the amplifier, the output signal is subject to errors.

The object of this invention is to provide means for stabilizing the base level of an amplifier in order to make it of zero value or at least constant when no input signal is present.

It is known that drift or deviations of the continuous level produce a markedly adverse effect on the resolving power of the amplifier, or more precisely of the device (e.g. a sensor of some kind) which is connected to the input of the amplifier and more generally affect the reliability of the device which the amplifier serves.

It is known that level drift can arise from a number of different causes, among which can be mentioned the following:
variations in ambient temperature,
local temperature variations of certain transistors as a function of the operating regime of the amplifier,
random variations.

The instability of the base level is liable to attain several hundred millivolts.

The solution which is usually adopted for these problems consists in the use of a base-line restorer which is a nonlinear circuit placed downstream of a coupling capacitor.

The design function of this circuit is to restore rapidly to zero any variation of the base-line level. It also has a favorable action with respect to slowly varying parasitic voltages such as hum voltages. However, this circuit has a serious disadvantage in that it has the effect of increasing variations in amplitude arising from background noise and does so to a greater extent as its efficiency is made higher.

Another solution, though less common, is offered by base-line stabilizers. In this case the output of the amplifier is directly coupled to the receiving device and to a negative feedback circuit which is intended to correct the deviations of the base line; the circuit just mentioned comprises a nonlinear element whose function is to prevent re-injection of the signals into the amplifier and terminates in a low-pass filter (integrator) which is intended to regularize the voltage applied as feedback.

In these devices, the nonlinear element can be constituted for example by two simple diodes; in this case the pulses on the base line are only partly eliminated. Even in the case in which the characteristics of the diodes are made ideal by means of operational amplifiers, the need to provide an access window for the direct-current control signal does not permit complete elimination of the pulses.

In other systems, the nonlinear element is a Robinson circuit. The current which is switched during the time interval of each pulse is integrated in the filter capacitor of this circuit, thus producing a residual signal.

In all cases, each pulse produces a residual signal whose waveform depends on the nonlinear circuit employed. By reason of the random character of the arrival of pulses, these signals produce after integration an effect which is comparable with a noise and impair the resolution of the device which is connected to the input of the amplifier.

The present invention is accordingly directed to a stabilizer for the base level of an amplifier which overcomes the disadvantages mentioned in the foregoing.

The device for stabilizing the output level of an amplifier having a number of amplifying stages essentially comprises, in series, between the output of the final amplifying stage and the input of one of the intermediate amplifying stages, an amplification assembly whose output is coupled with the input of an integrating circuit by means of a first controlled switch, the output of said integrating circuit being coupled with said input of one of the intermediate stages in order to be deducted from the input signal of said amplifier and a logical detection circuit whose input receives the signal delivered by said amplification assembly, said detection circuit being provided with two outputs, one output being coupled with the control of said first switch and the second output being coupled with the control of the second switch which is connected between the input of said integrating circuit and ground, said logical circuit being such as to open the first switch and to close the second in respect of any rapid-variation pulse applied to its input and being such as to close the first switch and to open the second switch when the signal applied to the input of said circuit gives rise to slow variations or to a continuous signal.

A more complete understanding of the invention will in any case be obtained from the following description of one embodiment of the invention which is given by way of example without any limitations being implied, reference being made to the accompanying drawings, in which.

The stabilization device which will now be described is particularly well suited to the case in which the amplifier whose output level is to be stabilized is employed at the output of a spectrometer.

It is readily apparent that the device could be employed for other types of amplifiers.

Figure 1:
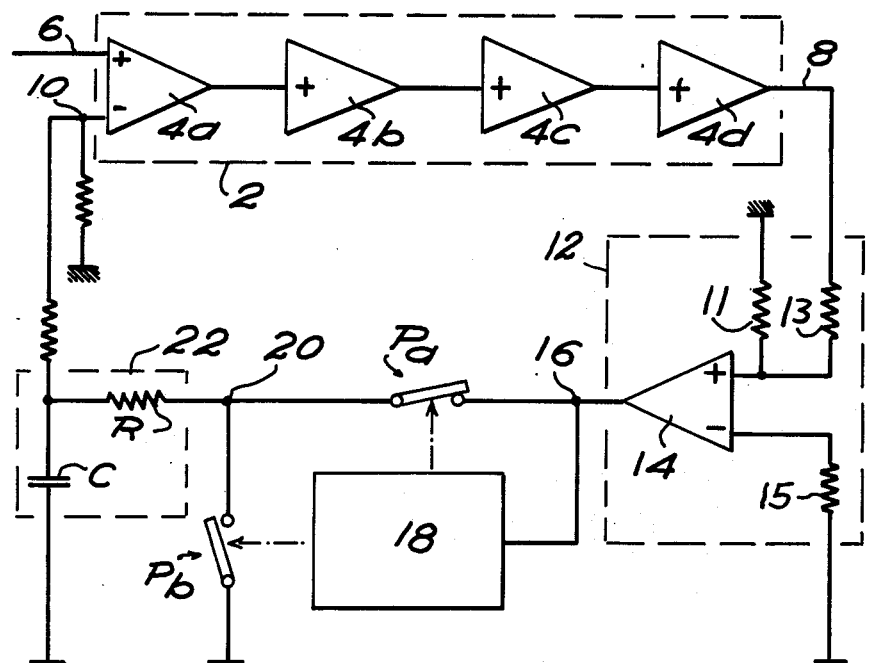
FIG. 1 is a diagram which illustrates the device as a whole.

There are shown in FIG. 1 the last stages of the amplifier in which it is desired to stabilize the base level. This subassembly 2 is constituted for example by four amplifying stages 4a, 4b, 4c 4d. The noninverting input of the amplifying stage 4a as designated by the reference 6 constitutes the input of the subassembly 2 and the output 8 of the amplifying stage 4d constitutes the output of the subassembly. The amplifying stage 4a has a second inverting input 10.

The entire stabilizing circuit is connected in a manner providing negative feedback for the amplification subassembly 2. Provision is made for an amplifying stage designated by the general reference 12. This amplifying stage can be constituted in known manner by an operational amplifier 14 associated with the resistors 11, 13 and 15. It is preferable to ensure that the amplifying stage 14 has a high gain and low temperature drift (for example a gain of the order of 100 dB). The output 16 of the amplifying stage 14 drives on the one hand logical detection circuit 18 which will be described in detail hereinafter and on the other hand the input of a controlled switch $P_a$. The switch $P_a$ is controlled by a first logical signal which is produced by the circuit 18 and controls the open or closed position of the switch $P_a$.

The output of the switch $P_a$ is connected to a point 20. This point 20 is connected by means of an electric conductor to the input terminal of a second switch $P_b$, the other terminal of which is connected to ground. The second switch $P_b$ is controlled by a second logical signal produced by the logical detection circuit 18.

The point 20 is also connected to the input of an integrating circuit 22. The output of the integrating circuit 22 is connected to the inverting input 10 of the amplifying stage 4a of the amplification subassembly 2.

In more general term, the electrical signal delivered by the integrator 22 must be subtracted from the signal applied to the input 6.

By way of example, the integrating circuit 22 can be constructed in known manner by means of a resistor R and a capacitor C.

Figure 2:
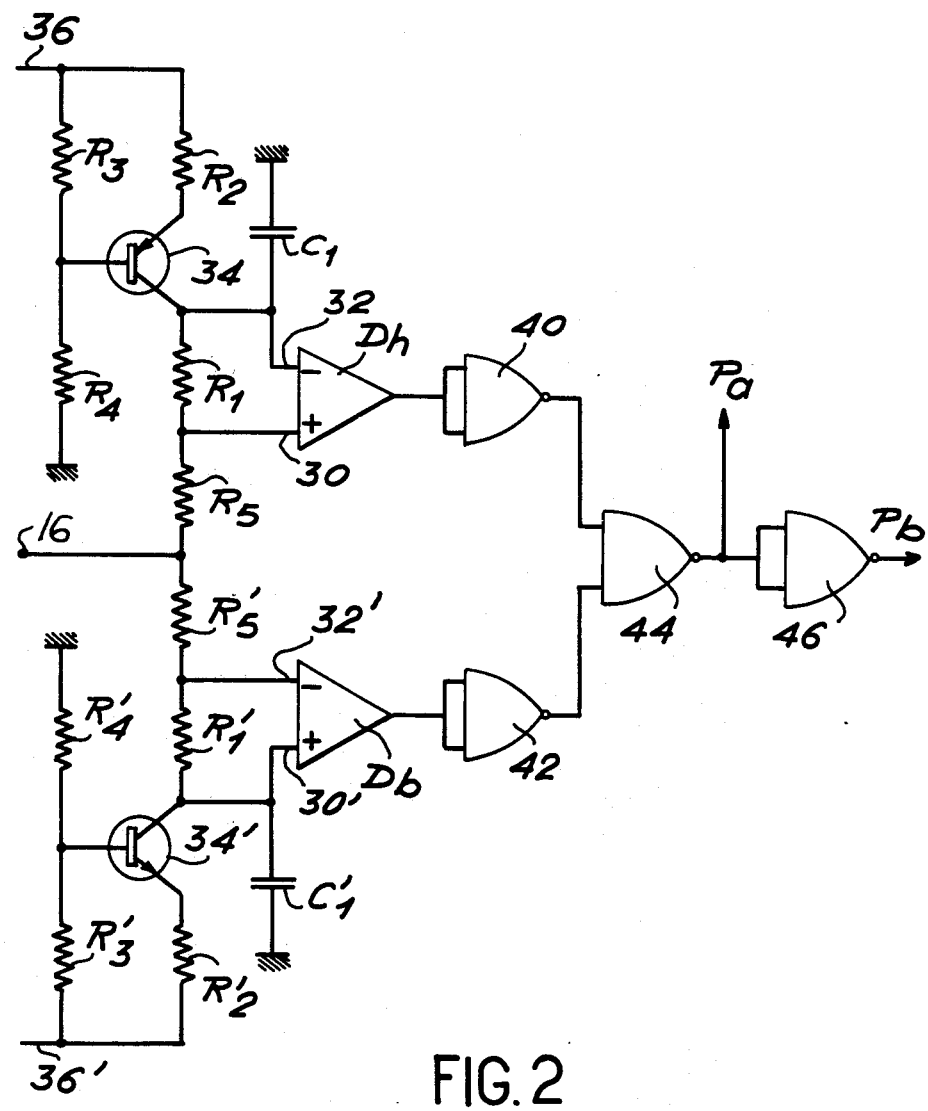
FIG. 2 is a diagram which illustrates one embodiment of the detection circuit.

There is shown in FIG. 2 a preferred embodiment of the logical detection circuit which serves to control the switches $P_a$ and $P_b$.

This circuit essentially comprises two discriminators $D_h$ and $D_b$, the former being a high-level discriminator and the latter being a low-level discriminator.

The threshold voltage of the discriminator $D_h$ is applied between the noninverting input 30 and the inverting input 32 through a resistor $R_1$. This resistor $R_1$ is supplied by a constant-level current generator constituted by the bipolar transistor 34 provided with its biasing resistors $R_2$, $R_3$ and $R_4$. In the particular example, the emitter of the transistor 34 is supplied with a voltage of $+12$ V at the point 36. The discriminator $D_b$ is supplied with a threshold voltage in the same manner. The elements which are equivalent to those of the discriminator $D_h$ are designated by the same references followed by the prime index. The low-level discriminator is supplied at the point 36' from a source of direct-current voltage of $-12$ V.

Moreover, the inverting input 32 of the discriminator $D_h$ is connected to one plate of a capacitor $C_1$, the other plate of which is connected to ground.

Similarly, the noninverting input 30' of the discriminator $D_b$ is connected to the first plate of a capacitor $C'_1$, the other plate of which is connected to ground.

The input 16 of the logical circuit is connected through resistors $R_5$ and $R'_5$ respectively to the inputs 30 and 32' of the two discriminators as well as to the resistors $R_1$ and $R'_1$.

In the particular case described, the threshold voltages of the discriminators are equal to 200 millivolts. The current supply circuits deliver currents of 200 microamperes and the resistors $R_1$ and $R'_1$ each have a value of 1000 ohms so that a threshold voltage of 200 millivolts is in fact developed between the two inputs of each discriminator.

The operation of these two discriminators is more clearly brought out by the following description. In the quiescent state, that is to say when no signal is applied to the input 16, the same signal is present on both inputs of the two discriminators. The output of these latter therefore remains in the zero state. In the case in which a slow-variation signal is applied at the point 16, identical signals are applied to both inputs of the two discriminators, irrespective of the sign of said signal, since the capacitors $C_1$ and $C'_1$ do not play any part in this case. In consequence, a zero signal is again present at the output of the discriminators $D_h$ and $D_b$.

If a positive signal having a fast rise time is applied to the input 16, the capacitors $C_1$ and $C'_1$ perform their function and the voltage applied to each input of the discriminators is different. Since the signal is positive, a logical "1" signal will be present on the output of the discriminator $D_h$ whereas a logical "0" signal will be present on the output of the discriminator $D_b$.

On the contrary, if a negative signal having rapid variations is applied to the input 16, a logical "0" signal will be present on the output of the discriminator $D_h$ and a logical "1" signal will be present on the output of the discriminator $D_b$ for the reasons explained earlier.

The processing of the logical signals delivered respectively by the discriminators $D_h$ and $D_b$ will now be described.

The output of the discriminator $D_h$ is connected to the input of a logical NOT, or inverter, circuit 40, said circuit being in turn connected to one of the inputs of a NAND-circuit 44. Similarly, the discriminator $D_b$ is connected to the input of a NOT-circuit 42 which is in turn connected to the second input of the NAND-circuit 44.

The output of the circuit 44 is connected to the input of a NOT-circuit 46. The output of the circuit 44 is connected to the control terminal of the switch $P_a$ and the output of the circuit 46 is connected to the control terminal of the switch $P_b$. As mentioned earlier, a logical "0" signal is present on the output of the discriminator $D_h$ unless the signal applied to the input 16 is positive and subject to rapid variations.

Similarly, a logical "0" signal is present on the output of the discriminator $D_b$ unless the signal applied to the input 16 is negative and subject to rapid variations. It is therefore apparent that a logical "1" signal is present on the output of the circuit 40 in all cases unless the input signal is positive and subject to rapid variations and a logical "1" signal is present on the output of the circuit 42 unless a negative signal having rapid variations is present on the input of the circuit. The logical "1" signal is therefore present on the output of the circuit 44 in all cases in which rapid variations of the signal take place at the input 16 and a logical "1" signal is present on the output of the circuit 46 in all other cases.

The switches $P_a$ and $P_b$ are so designed as to be open when the control input is at the logical level 1 and closed when the control signal is at the logical level 0.

It is therefore readily apparent that, whenever rapid variations occur in the signal applied to the input 16, the gate $P_a$ is open and the gate $P_b$ is closed whether said signal is positive or negative.

In the contrary case, that is to say in the case of slow or continuous variations, the gate $P_a$ is closed and the gate $P_b$ is open, thus providing an effective answer to the problem which is set.

It would clearly be possible to contemplate other particular forms of construction of the logical detection circuit. It is only necessary to ensure that this circuit provides at its output the logical level 1 on the gate $P_a$ and the logical level 0 on the gate $P_b$ when a rapid-variation signal is applied to the input of the detection circuit.

The gates $P_a$ and $P_b$ have been represented in the figures by mechanical switches. This representation is given solely in order to simplify the figure. In acual fact, these switches are constructed by means of integrated circuits. It is possible, for example, to employ gate-controlled field-effect transistors, the logical signals being applied to the gates of said transistors, which can be done with adaptation of the voltage level corresponding to the logical level 1 if desirable or necessary in view of the requirement of the particular field-effect transistors.

Figure 3:
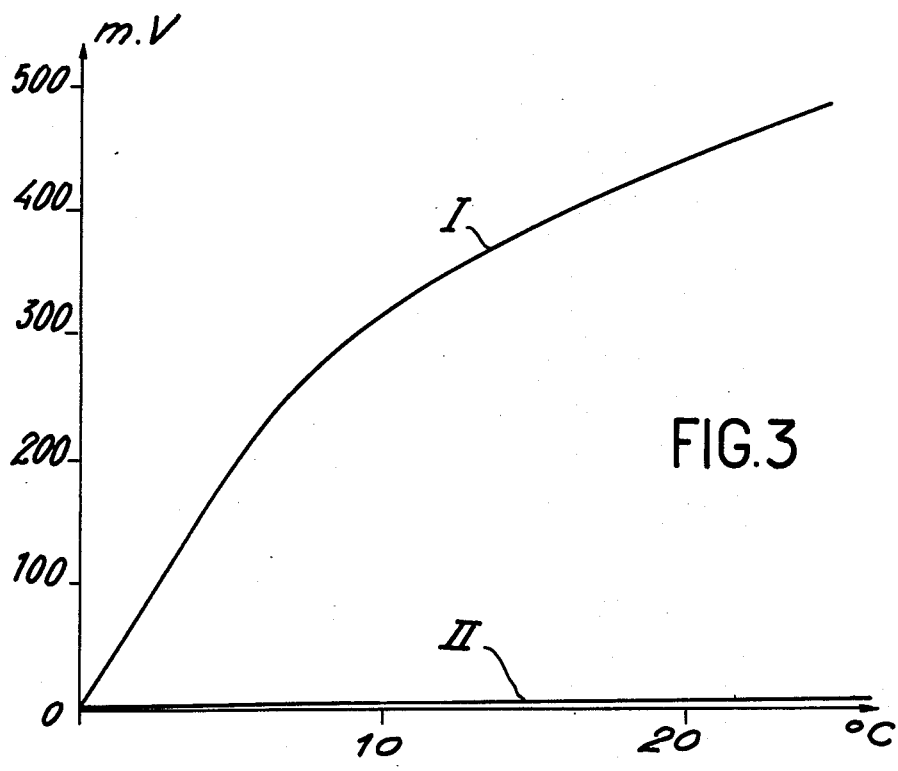
FIG. 3 is a graph in which two curves show the effect of the stabilizer on the temperature drift of an amplifier.

In order to give a clearer definition to the temperature-stabilizing effect of the device according to the invention, there are shown in FIG. 3 two curves which give the shift voltage at the amplifier output expressed in millivolts as a function of the variation in ambient temperature as recorded in °C on the axis of abscissae. The point 0 of these graduations corresponds to room temperature (for example 23° C) and the numerals indicated represent the deviations between the room temperature and the real temperature. The curve I represents the voltage deviation when the amplifier is employed at maximum gain without stabilizer. Curve II represents the voltage deviation at the output with the same amplifier which is employed under the same conditions but in conjunction with the stabilizer in accordance with the invention. It is apparent that a very considerable reduction of said temperature effect is obtained since there is a voltage deviation of the order of 450 millivolts in the case of a temperature of the order of 43° C and since said voltage deviation is reduced to 5 millivolts by means of the stabilizer.

It must also be noted that, in the case in which the amplifier is employed in a X- or $\gamma$-spectrometry chain, this device serves to ensure that the center of each peak of the spectrum corresponding to the radioactive source under analysis is made stable or practically stable irrespective of the count rate.

It is also worthy of note that this circuit has an overall time constant of the order of 10 $\mu$sec. This time constancy is particularly favorable when this circuit is incorporated in a spectrometer unit.

What we claim is:

1. A device for stabilizing the base level of an amplifier having a number of amplifying stages connected in succession, wherein said device comprises, in series between the output of the final amplifying stage and the input of one of the preceding amplifying stages, an amplification assembly whose output is coupled with the input of an integrating circuit by means of a first controlled switch, the output of said integrating circuit being coupled with said input of one of the preceding amplifying stages in a manner such as to be subtracted from the input signal of said amplifier and further comprises a second switch which is connected between the input of said integrating circuit and ground and a logical detection circuit provided with one input and two outputs, said input being connected to the output of said amplification assembly, a first of said two outputs being connected to the controlled input of the first switch and the second of said two outputs being connected to the control input of the second switch, said logical circuit including means for applying a switch-opening signal to said first output and a switch-closing signal to the second output when the signal applied to its input is a pulse having a rate of potential variation exceeding a predetermined variation rate, regardless of the polarity of variation, and means for applying a switch-closing signal to the first output and a switch-opening signal to the second output when the signal applied to the input of said circuit produces potential variations not exceeding said predetermined variation rate or a steady potential.

2. A device according to claim 1, wherein the logical detection circuit comprises first rate detection means connected to the input of said logical detection circuit for producing a signal of a first logical level whenever the signal applied to said input is positive and subject to potential variations exceeding a first predetermined variation rate and for producing a signal of a second logical level in all other cases, second rate detection means connected to the input of said logical detection circuit for producing a signal of the first logical level whenever the signal applied to said input is negative and subject to potential variations exceeding a second predetermined variation rate and for producing a signal of the second logical level in all other cases, said first and second predetermined potential variation rates being at least approximately equal, and means for logical processing of the signals produced by said first and second rate decision means.

3. A device according to claim 2, wherein the first rate detection means are constituted by a voltage discriminator having a noninverting input and an inverting input, means for driving said two inputs with said signal, including a resistance interposed therebetween said inputs, and for applying a threshold voltage between the two inputs, and a capacitor connected between said inverting input and ground.

4. A device according to claim 2, wherein said second rate detection means are constituted by a voltage discriminator having a noninverting input and an inverting input, means for driving said two inputs with said signal, including a resistance interposed between said inputs, and for applying a threshold voltage between the two inputs, and a capacitor connected between said noninverting input and ground.

5. A device according to claim 2, wherein said logical processing means comprise a first inverter circuit connected to the output of said first rate detection means, a second inverter circuit connected to the output of said second rate detection means, a NAND-circuit having two inputs, each input being connected to the output of one of the inverter circuits, and a third inverter circuit connected to the output of the NAND-circuit, the NAND-circuit output being coupled with the control of the first switch and the output of the third inverter circuit being coupled with the control of the second switch.

* * * * *